(12) United States Patent
Chen et al.

(10) Patent No.: US 8,962,349 B1
(45) Date of Patent: Feb. 24, 2015

(54) METHOD OF MANUFACTURING MAGNETIC TUNNEL JUNCTION MEMORY ELEMENT

(71) Applicant: Avalanche Technology Inc., Fremont, CA (US)

(72) Inventors: Benjamin Chen, San Jose, CA (US); Kimihiro Satoh, Beaverton, OR (US); Jing Zhang, Los Altos, CA (US); Dong Ha Jung, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/089,209

(22) Filed: Nov. 25, 2013

(51) Int. Cl.
*H01L 43/02* (2006.01)
*H01L 43/12* (2006.01)

(52) U.S. Cl.
CPC .............. *H01L 43/12* (2013.01); *H01L 43/02* (2013.01)
USPC ................. 438/3; 438/38; 257/421; 257/422; 257/E43.006

(58) Field of Classification Search
USPC ................. 438/3, 38; 257/421, 422, E43.006
See application file for complete search history.

(56) References Cited

U.S. PATENT DOCUMENTS

| | | | | |
|---|---|---|---|---|
| 2008/0001207 | A1* | 1/2008 | Guo et al. | 257/316 |
| 2009/0261434 | A1* | 10/2009 | Kang et al. | 257/421 |
| 2011/0235217 | A1* | 9/2011 | Chen et al. | 360/324.2 |
| 2013/0119494 | A1* | 5/2013 | Li et al. | 257/421 |

* cited by examiner

*Primary Examiner* — Mamadou Diallo
(74) *Attorney, Agent, or Firm* — Bing K. Yen

(57) ABSTRACT

The present invention is directed to a method for fabricating a magnetic tunnel junction (MTJ) memory element. The method comprises the steps of providing a substrate having a contact dielectric layer, a bottom dielectric layer, a bottom electrode layer, an etch stop layer, an MTJ layer stack, and a top electrode layer sequentially formed thereon; etching the top electrode layer with a first mask thereon to form a top electrode; etching the MTJ layer stack with the top electrode thereon to form a patterned MTJ; encapsulating the patterned MTJ with a passivation layer; depositing a top dielectric layer on top of the passivation layer and planarizing the same layer; forming a second mask on the top dielectric layer; and etching the bottom electrode layer, the etch stop layer, the passivation layer, and the top dielectric layer with the second mask thereon to form a bottom electrode.

20 Claims, 6 Drawing Sheets

METHOD OF MANUFACTURING MAGNETIC TUNNEL JUNCTION MEMORY ELEMENT

BACKGROUND

The present invention relates to spin transfer torque magnetic random access memory (STT-MRAM), and more particularly, to a method of manufacturing magnetic tunnel junction (MTJ) memory elements of STT-MRAM.

Spin transfer torque magnetic random access memory (STT-MRAM) is a new class of non-volatile memory, which can retain the stored information when powered off. An STT-MRAM device normally comprises an array of memory cells, each of which includes at least a magnetic memory element and a selection transistor coupled in series between appropriate electrodes. Upon application of an appropriate write current to the magnetic memory element, the electrical resistance of the magnetic memory element would change accordingly, thereby switching the stored logic in the respective memory cell.

The magnetic memory element typically includes a magnetic reference layer and a magnetic free layer with an insulating tunnel barrier or junction layer interposed therebetween, thereby collectively forming a magnetic tunneling junction (MTJ). The magnetic reference layer has a fixed magnetization direction and may be anti-ferromagnetically exchange coupled to a magnetic pinned layer, which has a fixed but opposite or anti-parallel magnetization direction. Upon the application of an appropriate write current through the MTJ, the magnetization direction of the magnetic free layer can be switched between two directions: parallel and anti-parallel with respect to the magnetization direction of the magnetic reference layer. The insulating tunnel junction layer is normally made of a dielectric material with a thickness ranging from a few to a few tens of angstroms. When the magnetization directions of the magnetic free and reference layers are substantially parallel, electrons polarized by the magnetic reference layer can tunnel through the insulating tunnel junction layer, thereby decreasing the electrical resistivity of the MTJ. Conversely, the electrical resistivity of the MTJ is high when the magnetization directions of the magnetic reference and free layers are substantially anti-parallel. Accordingly, the stored logic in the magnetic memory element can be switched by changing the magnetization direction of the magnetic free layer.

Based on the relative orientation between the magnetic layers and the magnetization directions thereof, an MTJ can be classified into one of two types: in-plane MTJ, the magnetization directions of which lie substantially within planes parallel to the layer plane, or perpendicular MTJ, the magnetization directions of which are substantially perpendicular to the layer plane.

FIG. 1 illustrates the formation of an MTJ memory element 50 by a conventional plasma etching process. The MTJ memory element 50, which includes a patterned MTJ 52 formed between a bottom electrode 54 and a top electrode 56, is disposed on top of a bottom contact 58 embedded in a dielectric layer 60, which is formed on top of a substrate 62. The bottom electrode 54, the patterned MTJ 52, and the top electrode 56 of the MTJ memory element 50 are formed by etching a bottom electrode layer, a MTJ layer stack, and a top electrode layer with a etch mask thereon. The MTJ etching process is typically carried out with a reactive plasma etching process that utilizes a reactive gas chemistry, such as ethanol or carbon dioxide. However, the MTJ etching process etches the bottom electrode layer slowly and thus requires a thick hard mask, which would in turn require a thick photo mask and prevent shrinking of the device size. Using a different gas chemistry to accelerate the etching of the bottom electrode layer would likely damage the patterned MTJ 52 by forming a reaction layer thereon. Moreover, since the bottom contact 58, which is typically made of a conductive material such as copper, is exposed to the plasma towards the end of the MTJ etching process, metallic material sputtered from top of the bottom contact 58 may redeposit on the surface of the patterned MTJ 52, thereby causing electric shunting of the MTJ memory element 50.

For the foregoing reasons, there is a need for a fabrication method that is scalable with the device size and that does not damage the memory element.

SUMMARY

The present invention is directed to a method that satisfy this need. A method for forming a magnetic tunnel junction (MTJ) memory element comprises the steps of providing a substrate having a contact dielectric layer, a bottom dielectric layer, a bottom electrode layer, an etch stop layer, an MTJ layer stack, and a top electrode layer sequentially formed thereon; forming a first mask on top of the top electrode layer; etching the top electrode layer with the first mask thereon to form a top electrode; etching the MTJ layer stack with the top electrode thereon to form a patterned MTJ; encapsulating the patterned MTJ with a passivation layer; depositing a top dielectric layer on top of the passivation layer and planarizing the top dielectric layer without exposing the passivation layer therebeneath; forming a second mask on top of the top dielectric layer with the second mask being aligned to the patterned MTJ and having substantially larger lateral dimension than the patterned MTJ; and etching the bottom electrode layer, the etch stop layer, the passivation layer, and the top dielectric layer with the second mask thereon to form a bottom electrode without exposing the patterned MTJ.

These and other features, aspects, and advantages of the present invention will become better understood with reference to the following description and appended claims.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features, including method steps, of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB can be an alloy, a compound, or a combination thereof, except where the context excludes that possibility.

Figure 2:
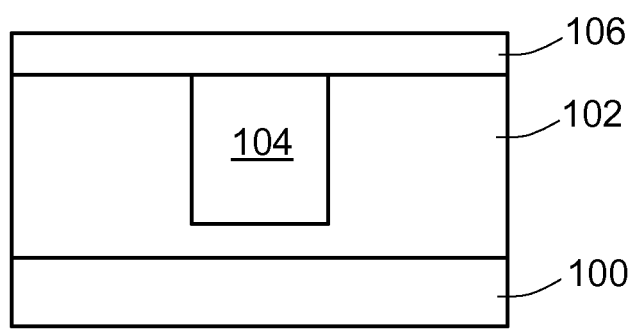
FIGS. 2-9 are cross sectional views illustrating various stages in formation of a MTJ memory elements according to method embodiments of the present invention.
Figure 3:
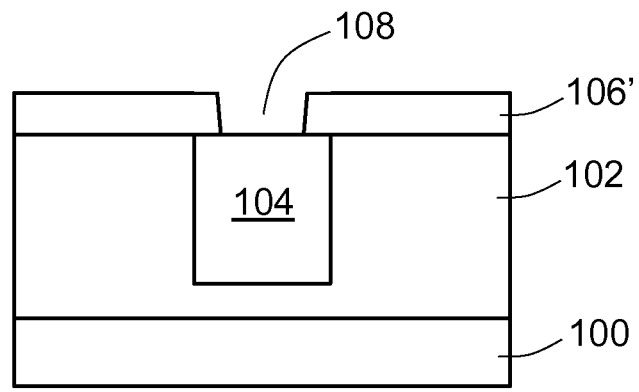

An embodiment of the present invention as applied to formation of an MTJ memory element will now be described with reference to FIGS. 2-9. Referring now to FIG. 2, the process begins by providing a substrate structure, which comprises a substrate 100, a contact dielectric layer 102 formed on top of the substrate 100, a bottom contact 104 embedded in the contact dielectric layer 102, and a bottom dielectric layer 106 formed on top of the bottom contact 104 and the contact dielectric layer 102. The substrate 100 may include other components (not shown) for operating a MRAM device, such as but not limited to logic and selection transistors. The contact and bottom dielectric layers 102 and 106 each may be made of any suitable dielectric material, such as but not limited to silicon oxide, silicon nitride, or silicon oxynitride. The bottom contact 104 may be made of any suitable conductor, such as but not limited to copper, tungsten, or aluminum, by a conventional Damascene process.

The processing continues by forming an opening 108 in the bottom dielectric layer 106', thereby exposing a portion of the bottom electrode 104 therebeneath as illustrated in FIG. 2. The opening 108 may be formed by photolithography and etching process.

Figure 4:
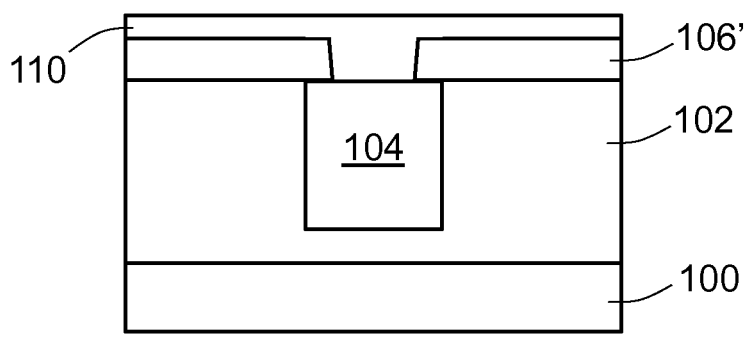

After the formation of the opening 108, a conductor material is deposited on top of the bottom dielectric layer 106' and into the opening 108 and is then planarized to form a bottom electrode layer 110, resulting in the structure illustrated in FIG. 4. The bottom electrode layer 110 is coupled to the bottom contact 104 by filling the opening 108 in the bottom dielectric layer 106'. The bottom electrode layer 110 may be made of any suitable conductor material, such as but not limited to titanium, zirconium, hafnium, vanadium, niobium, tantalum, chromium, molybdenum, tungsten, titanium nitride, zirconium nitride, hafnium nitride, tantalum nitride, tungsten nitride, or any combination thereof.

Figure 5:
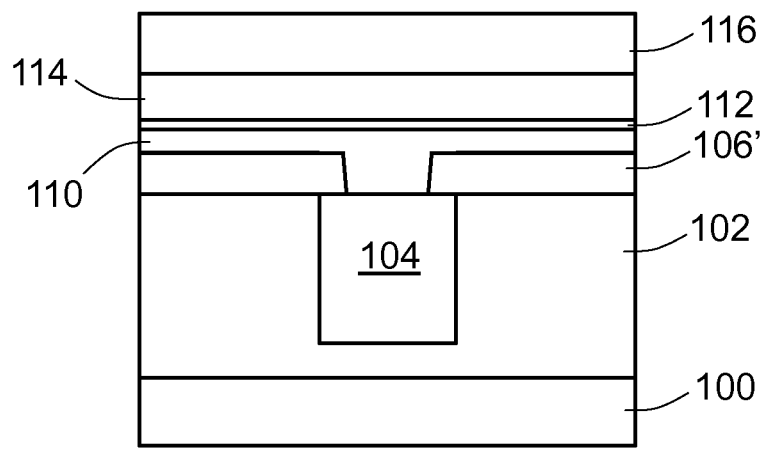

Referring to FIG. 5, an etch stop layer 112 is deposited on top of the bottom electrode layer 110. An MTJ layer stack 114 is deposited on top of the etch stop layer 112. A top electrode layer 116 is deposited on top of the MTJ layer stack 114. The etch stop layer 112 may be made of any suitable material which is etch resistant to the MTJ etching chemistry, such as but not limited to tantalum, titanium, ruthenium, or any combination thereof. The MTJ layer stack 114 may comprise a magnetic reference layer and a magnetic free layer with an insulating tunnel junction layer interposed therebetween and may have in-plane or perpendicular magnetic anisotropy. The MTJ stack layer 114 may also include a fixed magnetic layer anti-ferromagnetically coupled to the magnetic reference layer via an anti-ferromagnetic coupling layer. The MTJ stack layer 114 may also include other magnetic and non-magnetic layers, such as magnetic pinned layer, magnetic pinning layer, magnetic balance layer, magnetic assist layer, non-magnetic spacer layer, and non-magnetic perpendicular enhancement layer. The top electrode layer 116 may be made of any suitable conductor material, such as but not limited to titanium, zirconium, hafnium, vanadium, niobium, tantalum, chromium, molybdenum, tungsten, titanium nitride, zirconium nitride, hafnium nitride, tantalum nitride, tungsten nitride, or any combination thereof.

Figure 6:
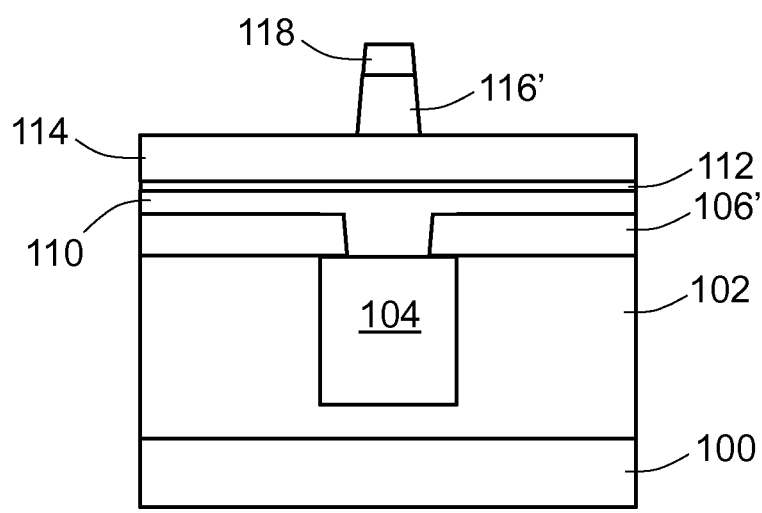

The top electrode layer 116 is etched with a first mask 118 thereon to form a top electrode 116' as illustrated in FIG. 6. The first mask 118 is aligned to the opening 108 and may be formed by photolithography and dry etching process. The first mask 118 may be made of an organic resist material patterned by photolithography or may alternatively be made of a suitable hard mask material, such as but not limited to silicon oxide, silicon nitride, silicon carbide, silicon oxynitride, amorphous carbon, or any combination thereof. The patterned top electrode 116' serves as an etch mask for subsequent MTJ etching process and provides the electrical connection between a MTJ therebeneath and a bit line thereabove in a finished device.

Figure 7:
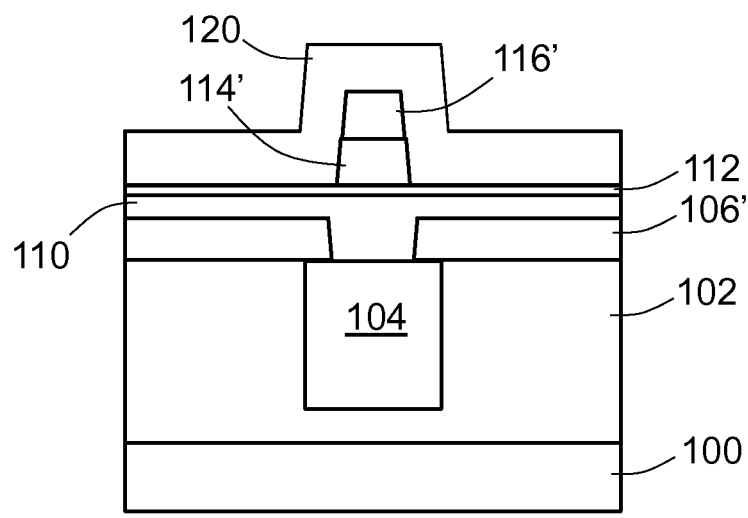

The MTJ layer stack 114 is etched with the top electrode 116' thereon to form a patterned MTJ 114' as illustrated in FIG. 7. The MTJ etching process stops on the etch stop layer 112, which may also provide end-point detection for the etching process. The MTJ etching process may be carried out with a reactive plasma etching process using a gas chemistry comprising methanol. The reactive plasma etching process may also be carried out using a gas chemistry comprising carbon dioxide and hydrogen or alternatively carbon monoxide and hydrogen. The MTJ etching process may also be carried by an ion beam etching process that utilizes an inert gas chemistry, such as but not limited to argon, xenon, krypton, or any combination thereof.

With continuing reference to FIG. 7, a passivation layer 120 is conformally deposited over the top electrode 116' and the patterned MTJ 114' after the formation of the patterned MTJ 114'. The passivation layer 120 serves to protect the patterned MTJ 114' from incurring potential damages during subsequent processing steps. The passivation layer 120 may be made of any suitable insulating material, such as but not limited to silicon nitride, silicon oxynitride, aluminum oxide, aluminum nitride, or any combination thereof.

Figure 8:
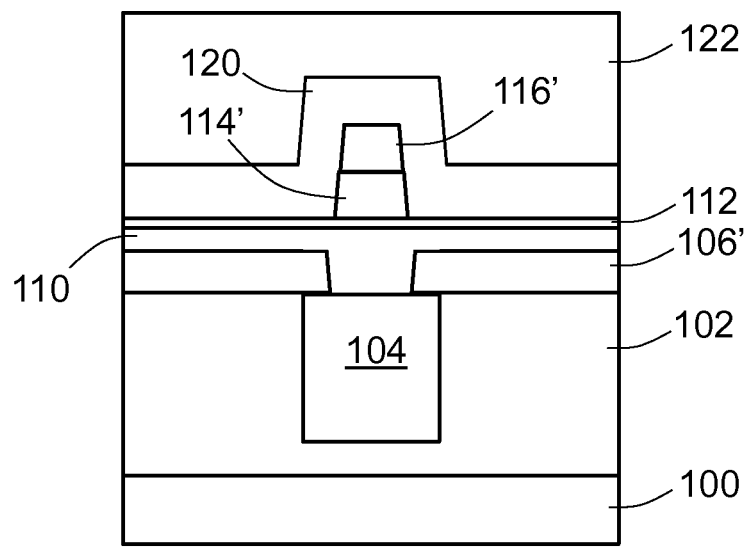
Figure 9:
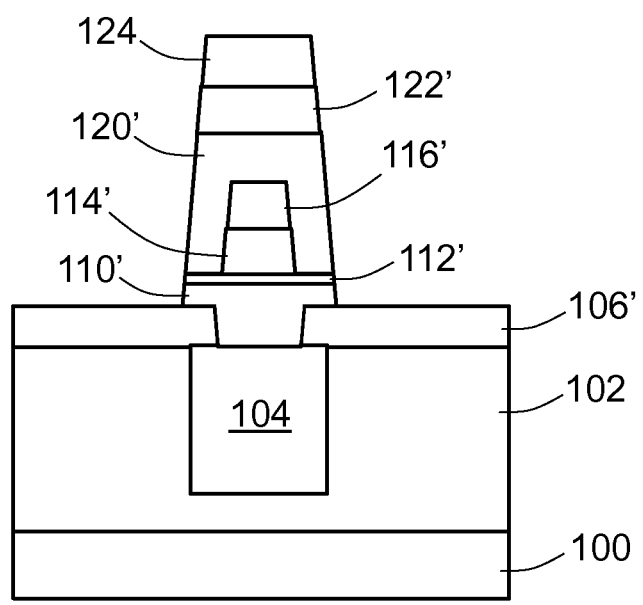

Referring to FIG. 8, a dielectric material is deposited onto the passivation layer 120 and is then planarized without exposing the passivation layer 120 therebeneath to form a top dielectric layer 122. The top dielectric layer 122 may be made of silicon oxide, silicon nitride, silicon oxynitride, or any dielectric material with a suitably small dielectric constant, such as but not limited to fluorine-doped silicon oxide, carbon-doped silicon oxide, or porous silicon.

The processing continues by patterning the bottom electrode layer 110. The bottom electrode layer 110, the etch stop layer 112, the passivation layer 120, and the top dielectric layer 122 are etched with a second mask 124 thereon to form a bottom electrode 110', a patterned etch stop layer 112', a patterned passivation layer 120', and a patterned top dielectric layer 122', respectively, resulting in the structure illustrated in FIG. 9. The second mask 124 is aligned to the patterned MTJ 114' and has a substantially larger lateral dimension than that of the patterned MTJ 114'. As such, the patterned MTJ 114', which is encapsulated by the passivation layer 120, is not exposed to the etching ambient in the current patterning step. The second mask 124 can be made of any suitable mask material, such as but not limited to organic resist, silicon oxide, silicon nitride, silicon oxynitride, silicon carbide, or any combination thereof. The bottom electrode etching process may be carried out with a reactive plasma etching process using a gas chemistry comprising fluorine or chlorine.

Figure 1:
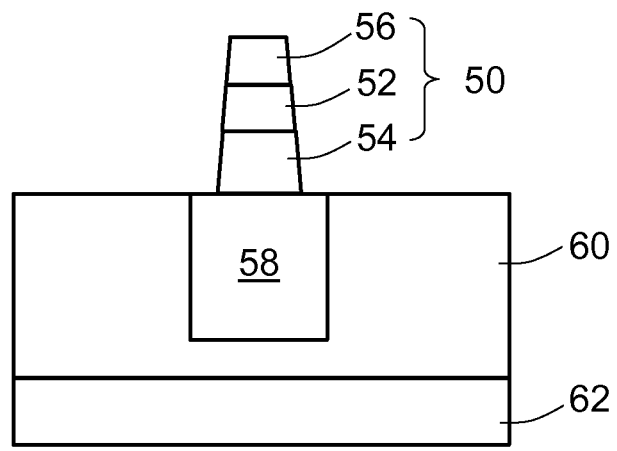
FIG. 1 is a cross sectional view of a MTJ memory element formed by a conventional method.

The prior art process of forming an MTJ memory element, as illustrated in FIG. 1, requires a thick mask or top electrode for etching both the MTJ layer stack and the bottom electrode layer, thereby requiring the mask to have a large lateral dimension. Moreover, the MTJ may be shunted if sputtered material from the bottom contact is redeposited onto the surface thereof. In contrast, the method of the present invention forms the MTJ and the bottom electrode in separate steps, allowing a thinner mask with a smaller critical dimension for patterning the MTJ.

Figure 10:
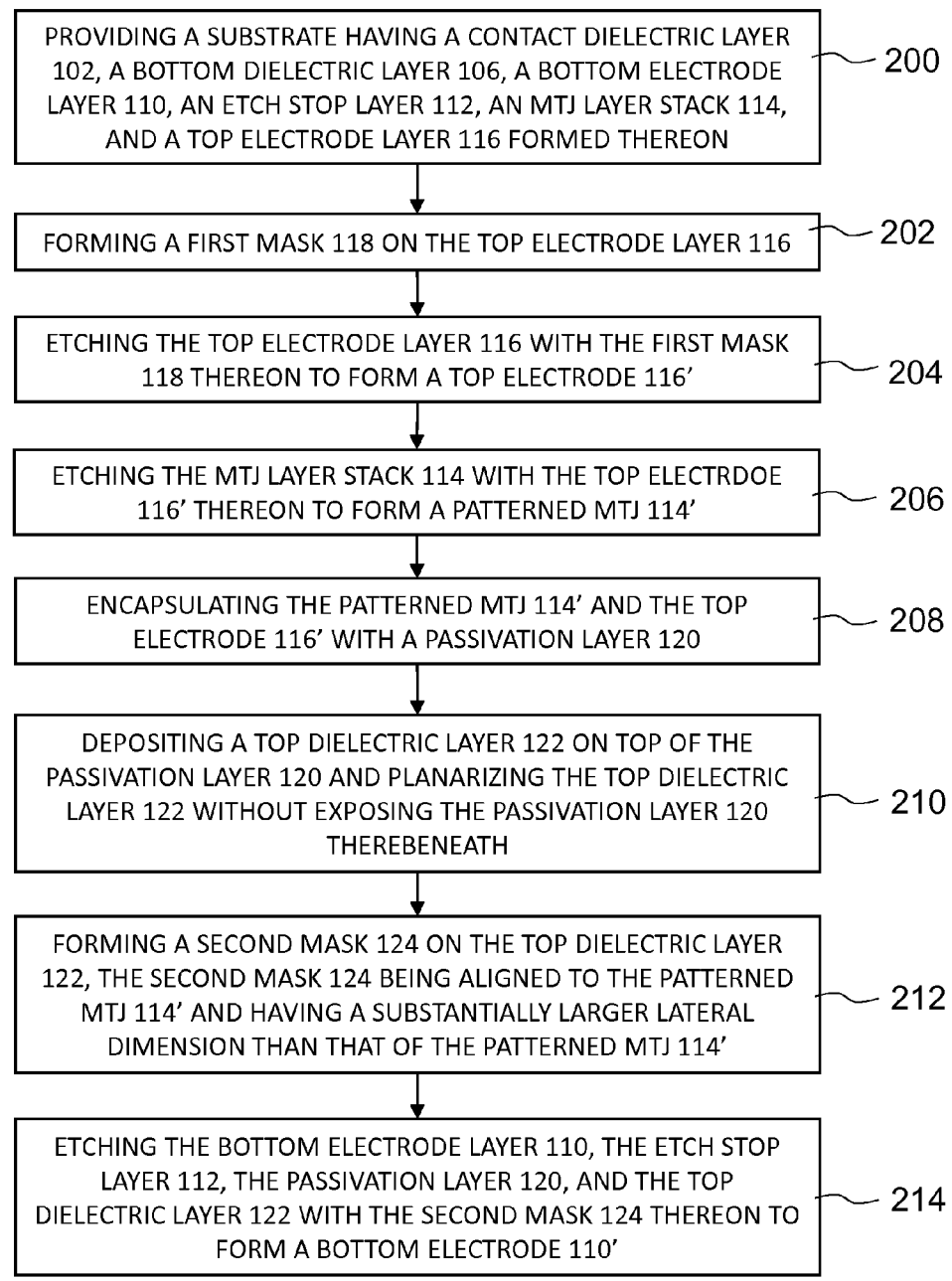
FIG. 10 illustrates selected stages in a method embodiment of the present invention corresponding to FIGS. 2-9.

FIG. 10 illustrates selected stages in a method embodiment of the present invention corresponding to FIGS. 2-9. The method comprises the steps of providing a substrate having a contact dielectric layer, a bottom dielectric layer, a bottom electrode layer, an etch stop layer, an MTJ layer stack, and a top electrode layer sequentially formed thereon 200; forming a first mask on top of the top electrode layer 202; etching the top electrode layer with the first mask thereon to form a top electrode 204; etching the MTJ layer stack with the top electrode thereon to form a patterned MTJ 206; encapsulating the patterned MTJ and the top electrode with a passivation layer 208; depositing a top dielectric layer on top of the passivation layer and planarizing the bottom dielectric layer without exposing the passivation layer therebeneath 210; forming a second mask on top of the top dielectric layer, the second mask being aligned to the patterned MTJ and having a substantially larger lateral dimension than that of the patterned MTJ 212; and etching the bottom electrode layer, the etch stop layer, the passivation layer, and the top dielectric layer with the second mask thereon to form a bottom electrode 214.

All the features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. §112, ¶6. In particular, the use of "step of" in the claims herein is not intended to invoke the provisions of 35 U.S.C. §112, ¶6.

What is claimed is:

1. A method of manufacturing a magnetic tunnel junction (MTJ) memory element comprising the steps of:
    providing a substrate including a bottom electrode layer, an etch stop layer, an MTJ layer stack, and a top electrode layer sequentially formed thereon;
    forming a first mask feature on top of said top electrode layer;
    etching said top electrode layer with said first mask feature thereon to form a top electrode;
    etching said MTJ layer stack with said top electrode thereon to form a patterned MTJ;
    encapsulating said patterned MTJ and said top electrode with a passivation layer;
    depositing a dielectric layer on top of said passivation layer;
    planarizing said dielectric layer without exposing said passivation layer therebeneath;
    forming a second mask feature on top of said dielectric layer, said second mask feature being aligned to said patterned MTJ and having a substantially larger lateral dimension than said patterned MTJ; and
    etching said bottom electrode layer, said etch stop layer, said passivation layer, and said dielectric layer with said second mask feature thereon to form a bottom electrode without exposing the patterned MTJ.

2. The method of claim 1, wherein said MTJ layer stack comprises a magnetic reference layer and a magnetic free layer with an insulating tunnel junction layer interposed therebetween.

3. The method of claim 1, wherein said MTJ layer stack comprises:
    a perpendicular magnetic free layer;
    a perpendicular magnetic reference layer separated from said perpendicular magnetic free layer by an insulating tunnel junction layer; and
    a perpendicular magnetic fixed layer separated from said perpendicular magnetic reference layer by an anti-ferromagnetic coupling layer.

4. The method of claim 1, wherein said bottom electrode is formed of a material selected from the group consisting of tantalum, titanium, tantalum nitride, titanium nitride, tungsten, tungsten nitride, and any combination thereof.

5. The method of claim 1, wherein said top electrode is formed of a material selected from the group consisting of tantalum, titanium, tantalum nitride, titanium nitride, tungsten, tungsten nitride, and any combination thereof.

6. The method of claim 1, wherein said etch stop layer is formed of tantalum or ruthenium.

7. The method of claim 1, wherein the step of etching said MTJ layer stack with said top electrode thereon is carried out with a reactive plasma etching process that utilizes a gas chemistry comprising methanol.

8. The method of claim 1, wherein the step of etching said MTJ layer stack with said top electrode thereon is carried out with a reactive plasma etching process that utilizes a gas chemistry comprising carbon dioxide and hydrogen.

9. The method of claim 1, wherein the step of etching said MTJ layer stack with said top electrode thereon is carried out with a reactive plasma etching process that utilizes a gas chemistry comprising carbon monoxide and hydrogen.

10. A method of manufacturing a magnetic tunnel junction (MTJ) memory element comprising the steps of:
    providing a substrate including a bottom contact embedded therein and a first dielectric layer formed on top of said substrate and having an opening above said bottom contact;
    depositing a bottom electrode layer on top of said first dielectric layer and into the opening;
    planarizing said bottom electrode layer without exposing said first dielectric layer therebeneath;
    sequentially depositing an etch stop layer, an MTJ layer stack, and a top electrode layer on top of said bottom electrode layer;
    forming a first mask feature on top of said top electrode layer;
    etching said top electrode layer with said first mask feature thereon to form a top electrode;
    etching said MTJ layer stack with said top electrode thereon to form a patterned MTJ;
    encapsulating said patterned MTJ and said top electrode with a passivation layer;
    depositing a second dielectric layer on top of said passivation layer;
    planarizing said second dielectric layer without exposing said passivation layer therebeneath;
    forming a second mask feature on top of said second dielectric layer, said second mask feature being aligned to said patterned MTJ and having a substantially larger lateral dimension than said patterned MTJ; and etching said bottom electrode layer, said etch stop layer, said passivation layer, and said second dielectric layer with said second mask feature thereon to form a bottom electrode without exposing the patterned MTJ.

11. The method of claim 10, wherein said MTJ layer stack comprises a magnetic reference layer and a magnetic free layer with an insulating tunnel junction layer interposed therebetween.

12. The method of claim 10, wherein said MTJ layer stack comprises:
a perpendicular magnetic free layer;
a perpendicular magnetic reference layer separated from said perpendicular magnetic free layer by an insulating tunnel junction layer; and
a perpendicular magnetic fixed layer separated from said perpendicular magnetic reference layer by an anti-ferromagnetic coupling layer.

13. The method of claim 10, wherein said bottom electrode is formed of a material selected from the group consisting of tantalum, titanium, tantalum nitride, titanium nitride, tungsten, tungsten nitride, and any combination thereof.

14. The method of claim 10, wherein said top electrode is formed of a material selected from the group consisting of tantalum, titanium, tantalum nitride, titanium nitride, tungsten, tungsten nitride, and any combination thereof.

15. The method of claim 10, wherein said etch stop layer is formed of tantalum or ruthenium.

16. The method of claim 10, wherein the step of etching said MTJ layer stack with said top electrode thereon is carried out with a reactive plasma etching process that utilizes a gas chemistry comprising methanol.

17. The method of claim 10, wherein the step of etching said MTJ layer stack with said top electrode thereon is carried out with a reactive plasma etching process that utilizes a gas chemistry comprising carbon dioxide and hydrogen.

18. The method of claim 10, wherein the step of etching said MTJ layer stack with said top electrode thereon is carried out with a reactive plasma etching process that utilizes a gas chemistry comprising carbon monoxide and hydrogen.

19. A method of manufacturing a magnetic tunnel junction (MTJ) memory element comprising the steps of:

providing a substrate including a copper contact embedded therein and a silicon nitride layer formed on top of said substrate and having an opening above said copper contact;
depositing a tantalum nitride bottom electrode layer on top of said silicon nitride layer and into the opening;
planarizing said tantalum nitride bottom electrode layer without exposing said silicon nitride layer therebeneath;
sequentially depositing a tantalum etch stop layer, an MTJ layer stack, and a tantalum top electrode layer on top of said tantalum nitride bottom electrode layer;
forming a first mask feature on top of said tantalum top electrode layer;
etching said tantalum top electrode layer with said first mask feature thereon to form a tantalum top electrode;
etching said MTJ layer stack with said tantalum top electrode thereon to form a patterned MTJ;
encapsulating said patterned MTJ and said tantalum top electrode with a silicon nitride passivation layer;
depositing a second dielectric layer on top of said silicon nitride passivation layer;
planarizing said second dielectric layer without exposing said silicon nitride passivation layer therebeneath;
forming a second mask feature on top of said second dielectric layer, said second mask feature being aligned to said patterned MTJ and having a substantially larger lateral dimension than said patterned MTJ; and
etching said tantalum nitride bottom electrode layer, said tantalum etch stop layer, said silicon nitride passivation layer, and said second dielectric layer with said second mask feature thereon to form a tantalum nitride bottom electrode without exposing the patterned MTJ.

20. The method of claim 19, wherein said MTJ layer stack comprises:
a perpendicular magnetic free layer;
a perpendicular magnetic reference layer separated from said perpendicular magnetic free layer by an insulating tunnel junction layer; and
a perpendicular magnetic fixed layer separated from said perpendicular magnetic reference layer by an anti-ferromagnetic coupling layer.

* * * * *